US011706989B2

(12) United States Patent
Ghyselen

(10) Patent No.: US 11,706,989 B2
(45) Date of Patent: Jul. 18, 2023

(54) METHODS FOR DESIGNING AND PRODUCING A DEVICE COMPRISING AN ARRAY OF MICROMACHINED ELEMENTS, AND DEVICE PRODUCED BY SAID METHODS

(71) Applicant: Soitec, Bernin (FR)

(72) Inventor: Bruno Ghyselen, Seyssinet (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 16/963,924

(22) PCT Filed: Jan. 18, 2019

(86) PCT No.: PCT/FR2019/050108
§ 371 (c)(1),
(2) Date: Jul. 22, 2020

(87) PCT Pub. No.: WO2019/141952
PCT Pub. Date: Jul. 25, 2019

(65) Prior Publication Data
US 2021/0043826 A1 Feb. 11, 2021

(30) Foreign Application Priority Data
Jan. 22, 2018 (FR) ..................... 1850484

(51) Int. Cl.
*B06B 1/02* (2006.01)
*H01L 41/09* (2006.01)
*H01L 41/22* (2013.01)

(52) U.S. Cl.
CPC .......... *H01L 41/0973* (2013.01); *H01L 41/22* (2013.01); *B06B 1/0292* (2013.01)

(58) Field of Classification Search
CPC .... H01L 41/0973; H01L 41/22; B06B 1/0292
See application file for complete search history.

(56) References Cited

U.S. PATENT DOCUMENTS 7,293,462 B2    11/2007  Lee et al.
10,539,539 B2 *  1/2020  Garlepp ............ H03K 17/9643
(Continued)

FOREIGN PATENT DOCUMENTS

FR       2880341 A1     7/2006
JP    2006-343315 A    12/2006
(Continued)

OTHER PUBLICATIONS

Ergun et al., Capacitive Micromachined Ultrasonic Transducers: Theory and Technology, Journal of Aerospace Engineering ASCE, vol. 16, No. 2, (Apr. 2003), pp. 76-84.
(Continued)

*Primary Examiner* — David Vu
*Assistant Examiner* — Brandon C Fox
(74) *Attorney, Agent, or Firm* — TraskBritt

(57) ABSTRACT

A design process is used for designing a device comprising a plurality of micro-machined elements, each comprising a flexible membrane, the elements being arranged in a plane in a determined topology. The design process comprises a step of defining the determined topology so that it has a character compatible with a generic substrate having cavities, the characteristics of which are pre-established. Each flexible membrane of the micro-machined elements is associated with one cavity of the generic substrate. The present disclosure also relates to a fabrication process for fabricating a device comprising a plurality of micro-machined elements, and to this device itself, wherein only some of the pairs of cavities and flexible membranes are configured to form a set of functional micro-machined elements.

14 Claims, 2 Drawing Sheets

(56) References Cited

U.S. PATENT DOCUMENTS

| | | | |
|---|---|---|---|
| 2013/0270967 A1 | 10/2013 | Dausch et al. | |
| 2014/0219063 A1 | 8/2014 | Hajati et al. | |
| 2016/0051225 A1* | 2/2016 | Kim | B06B 1/0215 |
| | | | 600/459 |
| 2017/0128983 A1 | 5/2017 | Horsley et al. | |
| 2017/0326591 A1* | 11/2017 | Apte | B06B 1/0292 |
| 2017/0328870 A1 | 11/2017 | Garlepp et al. | |
| 2018/0243792 A1* | 8/2018 | Rothberg | B81C 1/00698 |
| 2019/0290243 A1* | 9/2019 | Bryzek | A61B 8/4488 |

FOREIGN PATENT DOCUMENTS

| | | | | |
|---|---|---|---|---|
| JP | 2010172181 A | * | 8/2010 | ........... B06B 1/0292 |
| JP | 2011-044757 A | | 3/2011 | |
| TW | 200515531 A | | 5/2005 | |
| TW | 201739074 A | | 11/2017 | |
| WO | 2016/011172 A1 | | 1/2016 | |
| WO | WO-2016194591 A1 | * | 12/2016 | ............... A61B 8/00 |

OTHER PUBLICATIONS

International Search Report for International Application No. PCT/FR2019/050108 dated Apr. 29, 2019, 2 pages.

International Written Opinion for International Application No. PCT/FR2019/050108 dated Apr. 29, 2019, 6 pages.

Lu et al., Modeling, Fabrication, and Characterization of Piezoelectric Micromachined Ultrasonic Transducer Arrays Based on Cavity SOI Wafers, Journal of Microelectromechanical Sysytems, vol. 24, No. 4, (Aug. 2015), pp. 1142-1149.

Singapore Search Report for Application No. 11202006940S dated Sep. 22, 2021, 5 pages.

French Search Report and Written Opinion from French Application No. 1850484, dated Dec. 18, 2018, 13 Pages with English translation.

Japanese Notice of Reasons for Rejection for Application No. 2020-535609 dated Aug. 2, 2022, 2 pages.

Taiwanese Office Action for Application No. 1108102196 dated Aug. 12, 2022, 20 pages.

* cited by examiner

METHODS FOR DESIGNING AND PRODUCING A DEVICE COMPRISING AN ARRAY OF MICROMACHINED ELEMENTS, AND DEVICE PRODUCED BY SAID METHODS

CROSS-REFERENCE TO RELATED APPLICATIONS

This application is a national phase entry under 35 U.S.C. § 371 of International Patent Application PCT/FR2019/050108, filed Jan. 18, 2019, designating the United States of America and published as International Patent Publication WO 2019/141952 A1 on Jul. 25, 2019, which claims the benefit under Article 8 of the Patent Cooperation Treaty to French Patent Application Serial No. 1850484, filed Jan. 22, 2018.

TECHNICAL FIELD

The present disclosure relates to devices comprising an array of micro-machined elements arranged in a plane. More particularly, the present disclosure relates to an acoustic device implementing an array of micro-machined ultrasonic transducers. These transducers may be of piezoelectric or capacitive nature. The present disclosure is, for example, applicable to the field of ultrasound imaging.

BACKGROUND

The document (D1) Lu, Yipeng, and David A. Horsley, "Modeling, fabrication, and characterization of piezoelectric micro-machined ultrasonic transducer arrays based on cavity SOI wafers," *Journal of Microelectromechanical Systems* 24.4 (2015): 1142-1149 recalls that micro-machined ultrasonic transducers (MUTs) are formed from a membrane overhanging a cavity, the membrane having a low acoustic impedance and a good coupling to air or another fluid through which an acoustic wave propagates. In receiver mode, the bowing of the membrane under the effect of the acoustic wave is converted into an electrical signal. In emitter mode, an electrical signal makes the membrane bow in order to generate an acoustic wave.

Documents US20130270967, US20140219063 and US20170128983 provide other illustrations of MUT devices, and fabrication processes thereof.

MUT technology allows acoustic devices, which are, for example, applicable to the imaging field, to be designed and has many advantages, in particular, its ease of integration with signal-conditioning electronics, its low power consumption, a wide passband and the ease with which extensive arrays of transducers arranged in a plane may be fabricated therein.

MUT transducers may be classified into two categories depending on the mechanism of activation of the membrane.

Capacitive MUTs, a cross section of one of which has been schematically shown in FIG. 1a, have two electrodes 1a, 1b, one arranged on the membrane 2, the other generally being formed by the bottom of the cavity 3 that the membrane overhangs. This second electrode may therefore consist in a single contact 1b made on the carrier 4 on which the cavity 3 rests. These two electrodes form a capacitor, the capacitance of which depends on the degree of flexion of the membrane.

Piezoelectric MUTs, a cross section of one of which has been schematically shown in FIG. 1b, also have two electrodes 1a, 1b, which are arranged on the membrane 2, on either side of a layer 5 of piezoelectric materials. In this type of device, the layer 5 of piezoelectric materials is coupled to the membrane 2 order to make it bow or to track its bowing.

Whatever the type of MUTs that an acoustic device employs, the MUTs are generally arranged in a plane and in a determined topology, as is well illustrated in the document (D2) Ergun, Arif S., Goksen G. Yaralioglu, and Butrus T. Khuri-Yakub, "Capacitive micro-machined ultrasonic transducers: Theory and technology," *Journal of aerospace engineering* 16.2 (2003): 76-84.

By "topology" what is meant, in the context of the present disclosure, is the geometry of each transducer and, in particular, the shape and the dimensions (width, length or diameter, depth) of the cavity and of the associated membrane that it comprises, and the distribution in the plane of the transducers forming the acoustic device.

An example topology comprising a plurality of blocks b1, b2 of transducers, the blocks being separated from one another by a block separation distance p2 (measured between the center of two transducers arranged facing on opposite edges of two blocks b1, b2) is shown, very schematically, in FIG. 1c. A device may comprise one such block, or indeed several hundred such blocks separated from one another by a distance p2, for example, of about 10 to 100 microns. Contacts, tracks or other elements allowing, for example, the transducers to be connected to a conditioning circuit are generally arranged in the space available between each block. Each block has a determined width and length (which may be expressed in number of transducers in each of these dimensions) and delineates a 2D array of transducers t that are generally regularly distributed. One block may comprise several thousand transducers. Each transducer is separated from a neighboring transducer by a determined separation distance p1, typically comprised between one micron and 100 microns. Each transducer comprises a membrane overhanging a cavity that has, in the shown example, a circular shape and a diameter d (of a few microns to a few hundred microns). The topology is also defined by the depth of the cavities, which may be between one micron or less and several tens of microns or more.

The design of an acoustic device generally requires the topology that will be employed to be precisely defined, i.e., the number and dimensions of the blocks of transducers, the block separation distance, the arrangement of the transducers within a block (for example, in the form of a matrix array, the separation distance between two transducers being specified) the dimensions and shape of the cavities of each transducer, etc., to be precisely defined. These design parameters are dictated, to a certain extent, by the expected performance and the functionality of the acoustic device. It is not necessary for all the transducers or all the blocks of transducers of an acoustic device to all have the same dimensions or one single layout.

Document D1 also recalls that there are several ways of fabricating an acoustic device based on MUTs, depending on whether the transducers are fabricated at the same time, after, or separately to the analogue and digital signal-conditioning electrical circuits. This document thus proposes a simplified process for fabricating an acoustic device in which the transducers are fabricated separately from the conditioning circuits. This process takes advantage of cavities formed beforehand in a substrate to limit the number of photolithography mask levels needing to be employed.

This approach is attractive, but it means that some of the effort made designing the acoustic device must be borne by the manufacturer of the substrate. Specifically, the manufacturer of the substrate must be able to design and fabricate a substrate containing cavities having exactly the topology chosen for the device. However, device topology is often a piece of valuable and sensitive information that the device manufacturer generally does not want to divulge.

In addition, the substrate manufacturer must develop substrate fabrication processes specific to each topology. The effort required to do this makes rapid and economical development of acoustic devices more difficult.

It would therefore be desirable to be able to provide a substrate containing cavities that would be able to serve in the fabrication of a vast range of acoustic devices and that would therefore not require ad hoc development, for each acoustic device, of a specific substrate fabrication process.

BRIEF SUMMARY

With a view to achieving one of these aims, one subject of the present disclosure is a design process for designing a device comprising a plurality of micro-machined elements each comprising a flexible membrane, the elements being arranged in a plane in a determined topology. This design process comprises a step of defining the determined topology so that it has a character compatible with a generic substrate having cavities the characteristics of which are pre-established, each flexible membrane of the micro-machined elements being associated with one cavity of the generic substrate.

With a view to achieving one of these aims, one subject of the present disclosure is a design process for designing a device comprising a plurality of micro-machined elements each comprising a flexible membrane, the elements being arranged in a plane in a determined topology. This design process comprises a step of defining the determined topology so that it has a character compatible with a generic substrate having cavities the characteristics of which are pre-established, each flexible membrane of the micro-machined elements being associated with one cavity of the generic substrate.

Thus, a design rule is defined that sets the topology of the device so that its membranes are in register with the cavities of the generic substrate. It is therefore not necessary to develop one particular substrate designed for the topology of the device.

According to other advantageous and non-limiting features of the present disclosure, which may be implemented alone or in any technically feasible combination:
- in the step of defining the topology, the generic substrate is chosen from a group of generic substrates, the substrates having pre-established characteristics that differentiate them from one another;
- the defining step comprises selecting the generic substrate from the group of generic substrates, such that the determined topology is defined so as to be as similar as possible to a desired topology;
- the design process also comprises defining the thicknesses of the membranes;
- the step of defining the determined topology involves:
  - choosing the dimensions and shape of the membranes of the elements so that the dimensions and shape correspond to the shape of the cavities of the generic substrate;
  - choosing the arrangement of the membranes of the micro-machined elements in the plane so that they are all plumb with a cavity of the generic substrate when the device is in register with this substrate;
- the arrangement of the cavities of the generic substrate is regular and covers all its extent;
- the micro-machined elements are micro-mirrors or micro-machined acoustic or ultrasonic transducers;
- the generic substrate has cavities the sizes and/or shapes of which are not all identical.

According to another aspect, the present disclosure proposes a fabrication process for fabricating the designed acoustic device, which comprises a step of providing the generic substrate.

More generally, the present disclosure proposes a fabrication process for fabricating a device comprising a plurality of micro-machined elements, the process comprising:
- a step of providing a generic substrate comprising a surface layer arranged on a carrier, the main face of the carrier having emergent cavities and the portions of the surface layer overhanging the cavities forming flexible membranes associated with the cavities;
- at least one step of processing only certain of the pairs formed from one cavity and from one membrane in order to form at least one functional micro-machined element and at least one leftover pair that is not able to convert a movement of its membrane into an electrical signal or vice versa.

According to other advantageous and non-limiting features of this fabrication process, which may be implemented alone or in any technically feasible combination:
- the processing step also comprises removing a membrane and/or a cavity;
- the processing step also comprises a step of neutralizing a membrane and/or a cavity;
- at least one processing step comprises a step of producing an array of electrically conductive elements that is configured to connect only some of the cavity-membrane pairs;
- the production of the array of electrically conductive elements comprises forming electrodes plumb with only some of the cavities;
- the process comprises a step of adjusting the thickness of the flexible membranes;
- the generic substrate comprises an intermediate layer between the main face of the carrier and the surface layer;
- the process comprises a step of depositing at least one first electrode on the surface layer;
- the process comprises a step of depositing a piezoelectric layer on at least the first electrode;
- the process comprises a step of depositing a second electrode on the piezoelectric layer.

Lastly, the present disclosure proposes a device comprising a carrier and a surface layer arranged on the carrier, the main face of the carrier having emergent cavities and the portions of the surface layer overhanging the cavities forming flexible membranes associated with the cavities, only certain of the pairs formed from one cavity and from one flexible membrane being configured to form a set of functional micro-machined elements, at least one leftover pair not being able to convert a movement of its membrane into an electrical signal or vice versa.

According to other advantageous and non-limiting features of the device, which may be implemented alone or in any technically feasible combination:
- the device comprises an array of electrically conductive elements that is configured to connect only some of the cavity-membrane pairs;
- the micro-machined elements are micro-mirrors or micro-machined acoustic or ultrasonic transducers.

BRIEF DESCRIPTION OF THE DRAWINGS

Other features and advantages of the present disclosure will become apparent from the following detailed description of example embodiments of the present disclosure, which description is given with reference to the appended figures, wherein.

DETAILED DESCRIPTION

Figure 1A:
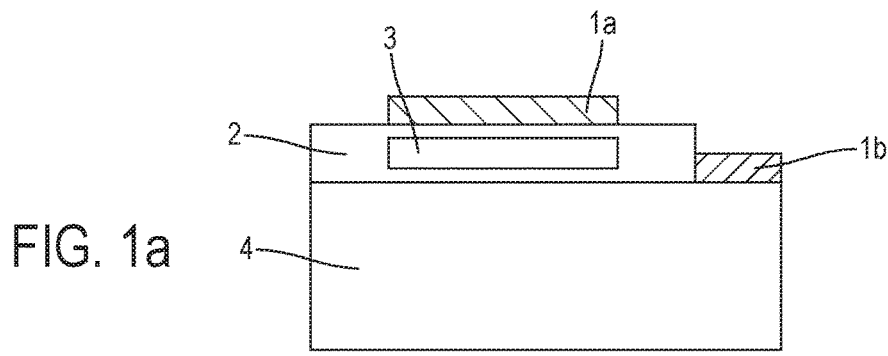
FIGS. 1a to 1c show a capacitive MUT, a piezoelectric MUT, and a topology of a prior-art acoustic device, respectively.
Figure 1B:
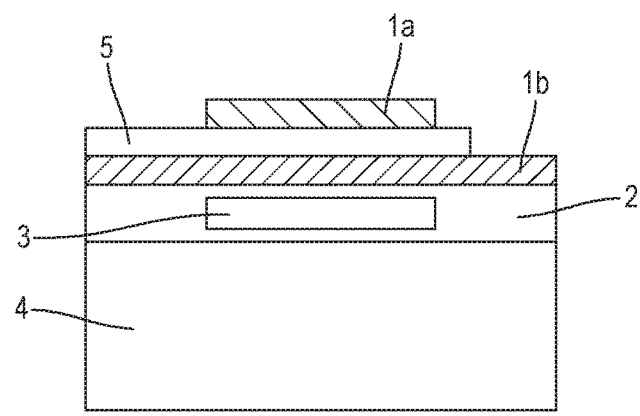

Very generally, the present disclosure on the one hand proposes a generic substrate (or a group of such generic substrates) having cavities overhung by membranes. On the other hand it aims to define design rules for a device, in particular, an acoustic device, so that it may be fabricated from such a generic substrate. At least some of the membranes and of the cavities of the generic substrate are intended to form functional micro-machined elements, such as the transducers of an acoustic device. Thus, the substrate manufacturer is able to provide, in bulk and at less cost, substrates without having to adjust the fabrication process to a specific customer requirement. A device manufacturer, in particular, a manufacturer of acoustic devices, who respects these design rules may stock up with substrates without sharing the often confidential characteristics of their product.

By "cavity," what is meant in the context of the present disclosure is any void formed in a substrate. It is not necessary for this void to be entirely closed or hermetically closed.

By "membrane" or "flexible membrane," what is meant is any structure suspended above a void in the substrate. It may have any shape, and, for example, form a partition or a beam. The perimeter of the suspended structure may be entirely or partially joined to the substrate. It may also be joined to the substrate via one or more feet. Whatever the way in which the structure is joined to the substrate, some at least of this structure has at least one degree of freedom of movement, making it flexible.

Generic Substrate

According to one aspect, the present disclosure therefore proposes to define a generic substrate 20 comprising cavities. Such a generic substrate 20, one example of which has been schematically shown in cross section in the FIG. 2a and as seen from above in FIG. 2b, may comprise a carrier 21 and a surface layer 23 arranged on the carrier. It may also comprise an intermediate layer 22 between a main face of the carrier and the surface layer. The carrier 21 comprises emergent cavities 24 that open onto its main face. The portions of the surface layer 23 overhanging the cavities 24 of the carrier 21 form a flexible membrane.

The generic substrate 20 may be very easily fabricated using a "bonding and thinning" type process. Such a process comprises providing the carrier 21 and forming, in the main face of this carrier 21, cavities 24, for example, by wet or dry etching, using, if necessary, a photolithography step to pattern a resist deposited beforehand on the main face of the carrier 21, so as to mask zones to be protected from the etching or to open zones to be etched.

The process may also comprise providing a donor substrate and bonding it to the carrier 21 so as to cover the emergent cavities 24. The carrier 21 and/or the donor substrate may have been equipped beforehand with layers, for example, dielectric layers, on the faces thereof that are intended to be bonded to form the buried intermediate layer 22 of the substrate 20. The one or more layers formed on the carrier 21 may be deposited before or after the emergent cavities 24 have been etched into the surface of this carrier. They may therefore, according to one variant, coat the walls defining these cavities.

In a following step, the donor substrate is thinned, this possibly being done mechanically, chemically or by fracture level with a weakened plane that is formed beforehand in the donor substrate, for example, by implanting gaseous species such as helium and/or hydrogen. The surface layer 23 may have a thickness comprised between 100 nm and several tens of microns, or even several hundred microns.

In certain cases, the bonding step may be carried out in a bonding chamber the atmosphere of which is controlled, for example, in order to have a determined vacuum pressure and/or a particular gaseous nature. Thus, the atmosphere present in the cavity, and, in particular, its vacuum level and/or the nature of the gas filling it, is controlled.

Preferably, the bonding step employs molecular bonding i.e., the clean and smooth bonded surfaces of the carrier 21 and of the donor substrate adhere to each other via Van der Waals or covalent forces, without requiring the application of an adhesive. The forces of adhesion may be strengthened via a heat treatment the temperature of which may be between 100° C. and 1000° C. or more, or promoted by a plasma or chemical treatment of the surfaces required to make contact, before the assembly thereof.

Variants of this process may be envisioned. By way of example, and as is known per se, the cavities 24 may be formed subsequently to the step of bonding the donor substrate and the carrier, and to the step of thinning the donor substrate. One commonplace way of proceeding in the field of fabrication of micro-machined devices is based on the use of silicon-on-insulator (SOI) substrates into which these cavities 24 are etched. Advantage is taken of the properties whereby the silicon and buried insulator can be etched selectively, to produce the cavities 24 in the buried intermediate layer 22 of the SOI substrate. Optionally, the apertures that allowed the cavities 24 to be selectively etched may be plugged after their formation, in order, in particular, to make them seal tight.

Advantageously, for reasons of availability and cost, the carrier 21 and the donor substrate consist of silicon wafers. They may thus be circular wafers, the diameter of which may be 200 mm, 300 mm or more. However, they may equally well be wafers of other materials, or be any material in a form other than a wafer. The material of the donor substrate will possibly, in particular, be chosen so that the surface layer 23, and, in particular, the portions of this layer overhanging the cavities 24 and forming membranes, has a determined stiffness, allowing the bowing of these membranes when they are placed under stress to be controlled. In the same way, provision will possibly be made to choose the nature of any intermediate layer 22 so as to modify the stiffness of the membranes. It is also possible to choose to form the intermediate layer from a dielectric (silicon dioxide or silicon nitride, for example) in order to electrically insulate the surface layer 23 from the carrier 21.

Provision may be made for alignment marks to be arranged in the surface layer 23 or on the sides of the generic substrate 20, so as to make it possible to know the location of the cavities with precision, and to allow electrodes and other layers required to complete the fabrication of transducers, or more generally of micro-machined elements, to be placed in perfect alignment with these cavities 24 and thus the elements to be made functional.

The substrate 20 has a generic character in that the shape, the dimensions, and the arrangement of the cavities over the extent of the substrate are not specific to one particular product or to one particular application.

Figure 2A:
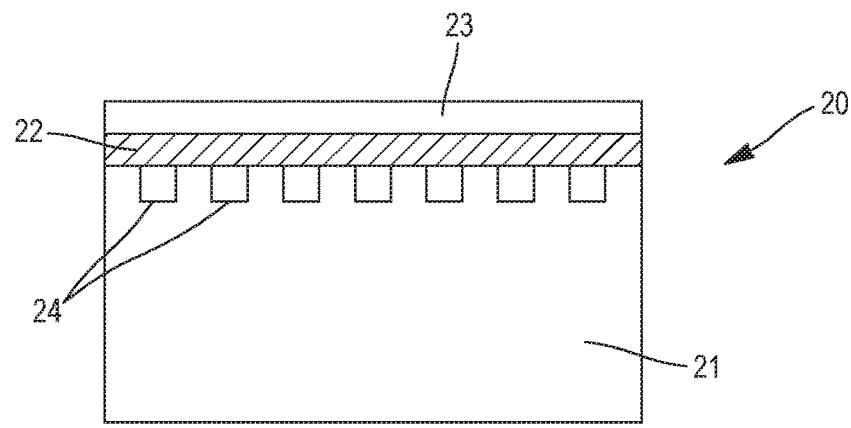
FIGS. 2a to 2c schematically show a cross-sectional view and top views of an example of a generic substrate according to the present disclosure.
Figure 2B:
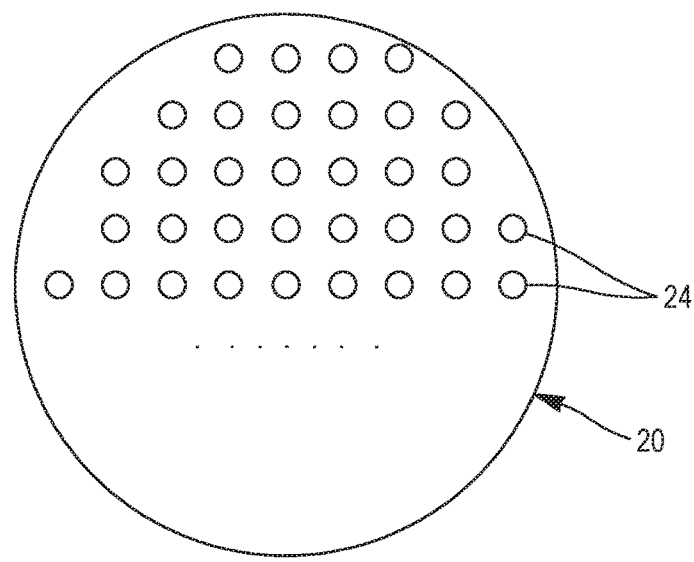

Thus, and as is shown in the example of FIG. 2b, the generic substrate may comprise a plurality of cavities 24 that are uniformly distributed over the entire extent of the substrate 20 and that all have the same shape and the same dimensions. The expression "the entire extent of the substrate" is understood to mean at least one central area of the main face of the substrate, this possibly excluding a zone peripheral to this area. In this example, all the cavities have a circular shape in the plane of the substrate, are of diameter equal to 40 µm, are of 0.2 µm depth and are uniformly distributed at the intersections of a grid, the generatrices of which are perpendicular to one another. The distance separating the center of a cavity from the center of an adjacent other cavity is equal to 100 µm.

Figure 2C:
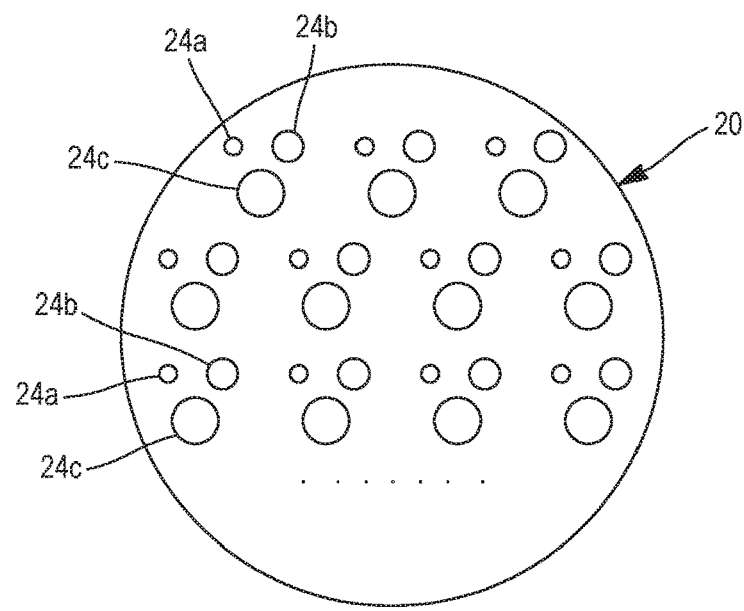

FIG. 2c shows a top view of a second example of a generic substrate 20. In this second example, the cavities 24a, 24b, 24c are arranged in groups, the groups of cavities being uniformly distributed over the surface of the substrate 20. Each group of cavities comprises, in the shown example, three cavities 24a, 24b, 24c of circular shape that are arranged in proximity to one another, and that have a diameter of 20 µm, 40 µm and 60 µm, respectively. The other parameters of the substrate 20 are the same as those of the first example.

More generally, a generic substrate may have a plurality of groups of cavities, each group of cavities having different characteristics (shape, dimensions, etc.). The groups of cavities may be arranged in separate zones of the surface of the substrate or, in contrast, the cavities of each group may be arranged side-by-side one another. Each group of cavities may be intended to form one micro-machined element having a determined function. By way of example, a first group of cavities may have cavity characteristics that make the cavities thereof particularly suitable for forming emitting transducers, and a second group of cavities may have cavity characteristics that make the cavities thereof particularly suitable for forming receiving transducers. In a second example embodiment, a first group of cavities may have cavity characteristics that make the cavities thereof particularly suitable for forming low-frequency transducers, and a second group of cavities may have cavity characteristics that make the cavities thereof particularly suitable for forming high-frequency transducers.

It is possible to envision, in the context of the present disclosure, providing a plurality of types of generic substrate 20. For example, provision may be made to create a collection of types of generic substrate modelled on the example of FIGS. 2a and 2b, and for which the diameter of the cavities 24 is chosen to be 5 µm, 20 µm, 40 µm and 60 µm, respectively.

More generally, the types of substrate of the collection have pre-established characteristics that differentiate them from one another.

Each of the types of generic substrate 20 requires a specific fabrication process that must be adjusted to take into account the size of the cavities 24 and the relative extent of the areas that are placed in contact. However, since the number of generic substrates from which the collection is formed is limited, it is relatively easy to define these processes beforehand and to implement them depending on which type of substrate is required.

Of course, the present disclosure is in no way limited to the just given example of a generic substrate 20. It is possible to envision cavities having a different shape, for example, a square, rectangular or even hexagonal shape, or a different depth or a different arrangement on the surface of the carrier. It is, in particular, not necessary for this arrangement to be regular or for it to cover the entire extent of the generic substrate, although this is particularly advantageous and allows constraints to be limited during the design of a device.

In any case, the present disclosure makes provision for a limited number (for example, 1, 3, 10 or 20) of types of generic substrate to be established, the characteristics of which are precisely predefined.

Design process for designing an acoustic device.

According to another aspect, the present disclosure proposes a design process for designing a device comprising micro-machined elements. In the example the description of which follows, the functional micro-machined elements are micro-machined ultrasonic transducers, and the device is an acoustic device. This process aims to establish a model of the device so that it may be subsequently fabricated on a generic substrate. Complementarily, it may also establish the various steps that must be implemented to fabricate the acoustic device from the generic substrate. Of course, the design process will take into account the chosen, capacitive or piezoelectric, nature of the transducers.

As has been seen, such a transducer comprises a flexible membrane overhanging a cavity, which may be hermetically closed and contain a controlled atmosphere, and two electrodes placed on either side of the membrane and/or of the cavity. Moreover, the electrodes of the transducers may be arranged otherwise. Specifically, a group of pairs that consist of one cavity/one associated flexible membrane, that are distributed side-by-side and that form one or more transducers, may be addressed by a single pair of electrodes placed at the ends of the group. It is also possible to envision arranging these electrodes differently, for example, to interdigitate them on a given face of the membrane, in particular, when the latter comprises a piezoelectric material. The transducers are all distributed in one plane and in a determined topology. For the sake of clarity, the shape and dimensions, in the plane, of a transducer will be considered to precisely correspond to the shape and dimensions of the membrane forming this transducer.

The design of the acoustic device comprises a step in which the determined topology of a plurality of transducers, i.e., of a plurality of micro-machined elements each comprising one flexible membrane, is defined. It may thus be a question of defining, depending on the targeted field of application and on the level of performance expected from the device, the number and the dimensions of the blocks of transducers, the distribution of the transducers in each block, the distances separating two adjacent blocks, and the shape and the dimensions of each transducer in the interior of each block.

According to the present disclosure, this defining step is carried out so that the defined topology has a character compatible with a generic substrate, i.e., a topology in which the flexible membranes of the micro-machined elements may be associated with the cavities of the generic substrate. In other words, this defining step requires the chosen topology to respect a set of design rules ensuring the compatibility of the topology with a generic substrate. It is thus guaranteed that, at the end of the process, the designed acoustic device may be fabricated from such a generic substrate.

Thus, care will be taken, in this step, to ensure that the shape and the dimensions (diameter, length, width, and/or depth) of the membranes of the transducers indeed correspond to the shape and to the dimensions of the cavities of a generic substrate.

Care will also be taken to ensure that the arrangement of the transducers in the plane of the topology is such that, projected onto the surface of a generic substrate, each transducer may be positioned plumb with a cavity. It is not however necessary for all the cavities of a generic substrate to correspond to one transducer, certain cavities of the generic substrate possibly not being employed in the acoustic device.

Thus, when a generic substrate comprises grouped-together cavities of various dimensions, as is the case in the second example of a generic substrate, which example is illustrated in FIG. 2c, the topology of the acoustic device will possibly be defined so that only the cavities of one particular dimension are used. Alternatively, the plurality of groups of cavities will possibly be used to form transducers having different properties, as was described in the aforementioned example.

By way of example, the latter rule may lead to the following being required:
  in each block of transducers, for the transducers to be uniformly distributed in the plane, and to be arranged at the nodes of a grid the generatrices of which are perpendicular to one another;
  for the distance separating two adjacent blocks to correspond to a multiple of the distance separating two transducers.

Thus, it is guaranteed that this distribution is not incompatible with a generic substrate of the type described with reference to FIGS. 2a-2c, i.e., a substrate the cavities of which are uniformly distributed in the plane of the substrate.

The design process is of course not limited to this topology-defining step. It comprises other steps such as the definition of the thickness of the membranes, the definition of the geometry and the routing of the electrodes in each block, the definition of zones of electrical contact around these blocks, and any other design steps that are conventionally implemented to make the micro-machined elements functional and to produce a complete model of an acoustic device.

The determined topology may differ from a desired topology, which could stem directly from functional analysis of the device that is in the process of being designed. For example, the dimensions and shape that the cavities of the transducers are required to have for these cavities to correspond to the shape and dimensions of the cavities of the generic substrate may lead to a discrepancy between the resonant frequency of the membrane and the frequency that was desired in the first steps of the design process.

To limit the impact of this discrepancy, a process according to the present disclosure may comprise a step of adjusting certain parameters of the acoustic device that is in the process of being designed. Of course, this adjusting step can concern only parameters that do not call into question the compatibility of the topology with the generic substrate. A process according to the present disclosure may also make provision for the introduction, into the process for fabricating the acoustic device, of complementary steps for adjusting certain parameters of the device during its fabrication.

By way of example, it is possible to envision modifying the thickness of the membrane during the fabrication of the device and to thus adjust the resonant frequency of a transducer. It is thus possible to compensate for any frequency discrepancy related to the cavity shapes and/or dimensions that had to be used because of the generic substrate. This adjustment, by thickening or thinning, may be made to the membrane of one particular transducer, to one group of transducers, or to all the transducers of the acoustic device. The material of the thickening layer may be chosen for its effect on the dynamic behavior of the membrane.

To limit the impact of discrepancies, provision will also possibly be made to provide a sufficient number of different generic substrates, well distributed over the design-choice space. In this case, there may be a generic substrate that, for any desired topology, requires a determined topology that is sufficiently close to the desired topology for the impact on the performance and functionality of the acoustic device to be minimal.

The design process for designing an acoustic device is naturally implemented by computational means. These means may be configured to facilitate the definition of the determined topology, for example, by automatically determining the determined topology from a desired topology. To do this, the process must have access, via available computational means, to the preset characteristics of the one or more generic substrates.

In the case where a collection or a group of generic substrates is available, the process may search for and choose the most suitable generic substrate of the group and propose the determined topology that is the most similar to the desired topology, i.e., the topology that affects the functionality and/or performance of the device the least.

Fabrication process for fabricating the acoustic device.

According to another aspect, the present disclosure also relates to a fabrication process for fabricating an acoustic device, and to a device fabricated using this process. As was noted above, at least certain steps of this fabrication process may have been defined, at least as regards their main parameters, during the design process itself.

The fabrication process comprises providing an example of the generic substrate that, in the design process, was selected from the group of generic substrates. Usually, a plurality of devices may be fabricated on a generic substrate using wafer-scale processing. It will be recalled that the generic substrate has cavities the characteristics of which are pre-established, the cavities, respectively, being associated with flexible membranes that overhang them.

According to this aspect of the present description, the fabrication process comprises at least one processing step in which only certain of the pairs formed from one membrane and from one cavity are activated or deactivated in order to form at least one functional micro-machined element and at least one leftover pair that is non-functional, i.e., that is not able to convert a movement of its membrane into an electrical signal or vice versa.

Figure 1C:
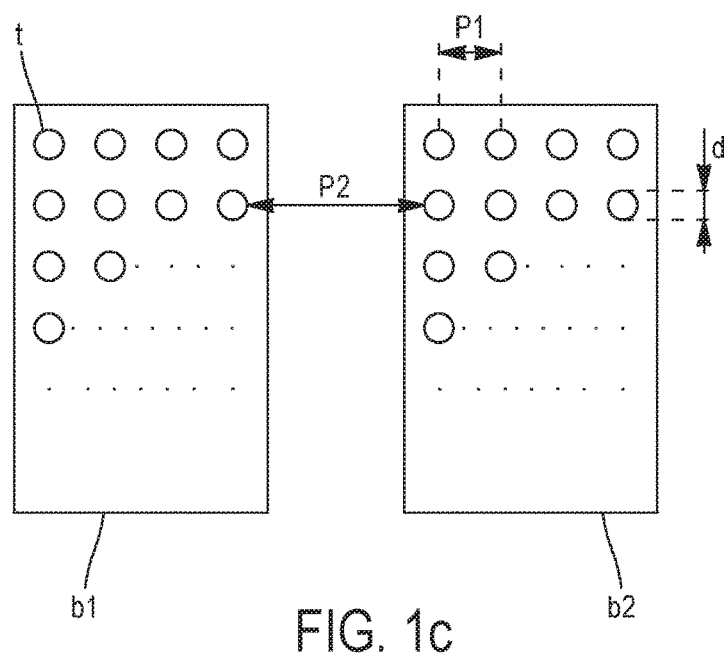

Certain of these processing steps are carried out only on those membranes of the generic substrate that are specified, in the topology, as being required to form a transducer. As was seen above, it is therefore not necessary for the processing steps to lead to transducers being formed from all the cavities present in the generic substrate. Thus, with reference once again to FIG. 1c, the zones separating two adjacent blocks of transducers will not be processed in certain of these processing steps, although they overhang cavities of the generic substrate.

In other words, in the fabrication process, certain of the pairs formed from one cavity and from one membrane of the generic substrate are activated to form functional micro-machined elements, i.e., elements able to reciprocally convert a movement of the membrane into an electrical signal.

The one or more inactivated or deactivated leftover cavity-membrane pairs will therefore not be used by the acoustic device.

Thus, in one embodiment, the leftover cavity-membrane pairs of the generic substrate, i.e., pairs not selected in the design phase, are removed. This removal may be achieved via a processing step in which the associated cavity-membrane assemblies are completely or partially etched away.

In another embodiment, the leftover cavity-membrane pairs of the generic substrate, i.e., pairs not selected in the design phase, are neutralized, without necessarily causing any trace thereof to disappear. Such a neutralization may be achieved via a processing step and take multiple forms: the flexible membrane may be blocked, the routing of interconnects may be interrupted, the operating points with respect to a resonant frequency may be shifted, or the membrane may even be pierced, etc.

One processing step may also comprise a step of adjusting the thickness of the surface layer, in order to adjust the thickness of the membranes overhanging the cavities. The adjusted thickness of the membranes may be obtained by thickening or thinning the surface layer. This thinning or thickening may be carried out locally, on the membrane of one particular transducer or on one group of transducers, or on all the membranes of the device, using conventional photolithography techniques allowing the zones to be thinned and/or thickened to be defined. Thinning is preferably achieved via an etching step: chemical etching in solution, gaseous or plasma chemical etching, sacrificial oxidation, or physical etching by ion-beam sputtering. Thickening is preferably achieved via deposition of the same material as that initially forming the membrane, in general silicon. The deposited layer may be single-crystal when it is a question of epitaxy. However, it may also be polycrystalline or amorphous. It is also possible to make use of other materials so as to produce, by way of end result, heterogeneous suspended structures: for example, a deposition of $SiO_2$, $Si_3N_4$ or of metal on an initial membrane made of single-crystal silicon. Thickening may also be achieved by oxidation, by converting some of the thickness of the original silicon film into $SiO_2$, which oxidation is accompanied by an effect that swells the layer, which effect is well known and well characterized by those skilled in the art. Other variations in and adjustments of thickness are liable to occur in several steps of the production process for fabricating the acoustic device: for example, during the formation of a piezoelectric layer, or even the production of the electrodes.

A processing step may also comprise a step of producing an array of electrically conductive elements configured to electrically connect certain of the cavity-membrane pairs and to make the corresponding micro-machined elements functional. The production of the array of electrically conductive elements may comprise forming electrodes, in particular, plumb with only some of the cavities.

Depending on whether the employed transducers are capacitive or piezoelectric, the fabrication process will comprise other processing steps required to complete the fabrication of the transducers.

It may thus comprise a step of depositing at least one first electrode on the surface layer, and in the case of a piezoelectric transducer, a step of depositing a piezoelectric layer on the first electrode, and a step of depositing a second electrode on the piezoelectric layer.

In the case of a capacitive transducer, it may be necessary to produce an aperture in order to allow the second electrode to be placed on the carrier.

At the end of the fabrication process, an acoustic device comprising a carrier and a surface layer placed on the main face of the carrier is obtained. The carrier has emergent cavities and the portions of the surface layer overhanging the cavities form flexible membranes that are associated with the cavities. Only some of the pairs formed from one cavity and from one flexible membrane of the generic substrate are configured to form a set of functional micro-machined elements, i.e., elements able to reciprocally convert a movement of the membrane into an electrical signal.

As was seen above, the cavities and/or the membranes of the generic substrate that are not activated, for example, those arranged in the zones separating two blocks of transducers, may be preserved, neutralized or removed, for example, by wet or dry etching of the surface layer, of the intermediate layer if it is present, or even of one portion of the carrier. Thus, flexible membranes that are not activated and the cavities that they overhang are removed.

It is also possible to use certain unemployed zones of the substrate, which nonetheless comprise cavities, as streets for the dicing of the substrate to singulate the devices fabricated by wafer-scale processing of the generic substrate.

Of course, the present disclosure is not limited to the described embodiments and examples and variant embodiments may be rendered therefrom without departing from the scope of the present disclosure such as defined by the claims.

The present disclosure, is, in particular, not limited to the design or manufacture of acoustic devices comprising micro-machined ultrasonic transducers.

It may, for example, be a question of transducers able to operate in frequency ranges other than the ultrasound frequency range. It is thus possible to envision forming loudspeakers or microphone arrays. Each transducer may then be addressed individually or with packages, this being particularly advantageous in the field of high-fidelity acoustics or directional acoustics.

The present disclosure is more generally applicable to any device comprising a plurality of micro-machined elements employing membranes or other suspended structures that are arranged in an array in a plane and in a particular topology, and that are able to be processed to form functional micro-machined elements.

It may thus, for example, be a question of micro-machined elements defining reflective zones with a view to forming arrays of controllable movable micro-mirrors. Such micro-systems may be produced with a view to forming light beams, such systems enabling new projecting systems, screens and remote-recognition systems. In this case, the flexible membranes of the generic substrates form the carrier of the micro-mirrors, which become movable and controllable after they have been functionalized in the topology determined in the design phase. The cavities in this case correspond to the void produced in the substrate in order to make it possible for the micro-mirrors to see-saw. The micro-mirrors may be anchored in several ways: via the entirety or some of their perimeter, via a single central foot or in contrast via multiple and distributed feet. The activation or in contrast the deactivation of only some of the micro-mirrors may be achieved in many ways: simple removal by selective etching; releasing or in contrast blocking the micro-mirrors by removing or forming blocking points, respectively; forming or in contrast removing a reflective layer from the micro-mirrors; forming or in contrast removing an absorbing layer from the micro-mirrors.

The invention claimed is:

1. A fabrication process for fabricating a device comprising a plurality of micro-machined elements, the process comprising:
    a step of providing a generic substrate comprising a surface layer arranged on a carrier, a main face of the carrier having emergent cavities and portions of the surface layer overhanging the cavities forming flexible membranes associated with the cavities; and
    at least one step of processing only certain pairs formed from one membrane and from one cavity in order to form at least one functional micro-machined element and at least one leftover pair that is not able to convert a movement of its membrane into an electrical signal or vice versa, wherein the at least one step of processing only certain pairs comprises removing a membrane and/or a cavity.

2. The process of claim 1, wherein the at least one step of processing only certain pairs comprises neutralizing a membrane and/or a cavity.

3. The process of claim 2, wherein the at least one step of processing only certain pairs comprises a step of producing an array of electrically conductive elements configured to connect only some of the pairs formed from one membrane and from one cavity.

4. The process of claim 3, wherein the step of producing the array of electrically conductive elements comprises forming electrodes plumb with only some of the cavities.

5. The process of claim 4, further comprising a step of adjusting a thickness of the flexible membranes.

6. The process of claim 5, wherein the generic substrate further comprises an intermediate layer between the main face of the carrier and the surface layer.

7. The process of claim 1, further comprising a step of depositing at least one first electrode on the surface layer.

8. The process of claim 7, further comprising a step of depositing a piezoelectric layer on at least the first electrode.

9. The process of claim 8, further comprising a step of depositing a second electrode on the piezoelectric layer.

10. The process of claim 1, wherein the at least one step of processing only certain pairs comprises neutralizing a membrane and/or a cavity.

11. The process of claim 1, wherein the at least one step of processing only certain pairs comprises a step of producing an array of electrically conductive elements configured to connect only some of the pairs formed from one membrane and from one cavity.

12. The process of claim 11, wherein the step of producing the array of electrically conductive elements comprises forming electrodes plumb with only some of the cavities.

13. The process of claim 1, further comprising a step of adjusting a thickness of the flexible membranes.

14. The process of claim 1, wherein the generic substrate further comprises an intermediate layer between the main face of the carrier and the surface layer.

* * * * *